(12) United States Patent
Sahoo et al.

(10) Patent No.: US 11,955,908 B2
(45) Date of Patent: Apr. 9, 2024

(54) AUTO-CONFIGURABLE ENERGY STORAGE SYSTEM

(71) Applicant: Apple Inc., Cupertino, CA (US)

(72) Inventors: Ashish K. Sahoo, Santa Clara, CA (US); Brandon Pierquet, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 148 days.

(21) Appl. No.: 17/386,543

(22) Filed: Jul. 28, 2021

(65) Prior Publication Data

US 2023/0029981 A1 Feb. 2, 2023

(51) Int. Cl.
*H02M 7/797* (2006.01)
*H02M 1/08* (2006.01)
*H02M 3/155* (2006.01)

(52) U.S. Cl.
CPC .............. *H02M 7/797* (2013.01); *H02M 1/08* (2013.01); *H02M 3/155* (2013.01)

(58) Field of Classification Search
CPC ........ H02M 7/797; H02M 1/08; H02M 3/155; H02M 1/4233; H02M 7/53871; H02M 1/32; G01R 19/2513; H02H 7/1213; H02H 7/1227
See application file for complete search history.

(56) References Cited

U.S. PATENT DOCUMENTS

| | | | |
|---|---|---|---|
| 6,404,348 B1 | 6/2002 | Wilfong | |
| 10,749,348 B2 * | 8/2020 | Moriyama | ............. H01H 3/001 |
| 11,251,625 B2 * | 2/2022 | Sun | ........................... H02J 7/00 |
| 2010/0181830 A1 | 7/2010 | Fornage et al. | |
| 2012/0074953 A1 * | 3/2012 | Stickelmann | ......... G01R 31/67 324/537 |
| 2012/0119751 A1 * | 5/2012 | Scott | ..................... G01R 31/52 324/536 |
| 2013/0057200 A1 * | 3/2013 | Potts | .................. H02M 7/4807 320/107 |
| 2014/0111185 A1 | 4/2014 | Cordero-Orille et al. | |

(Continued)

FOREIGN PATENT DOCUMENTS

CN 213783174 U 7/2021

OTHER PUBLICATIONS

International Search Report and Written Opinion for PCT Application No. PCT/US2022/030861 dated Aug. 23, 2022; 13 pgs.

*Primary Examiner* — Shawki S Ismail
*Assistant Examiner* — Htet Z Kyaw
(74) *Attorney, Agent, or Firm* — FLETCHER YODER PC

(57) ABSTRACT

An energy storage system can include a battery, a power converter comprising a first plurality of switching devices coupled to the battery and a second plurality of switching devices coupled between the first plurality of switching devices and an AC power system, and control circuitry that determines whether the AC power system is a single/split phase system or a three phase system and operates the first and second pluralities of switching devices accordingly. The control circuitry can include a microcontroller and a plurality of voltage sensors each configured to monitor a magnitude and a phase of a voltage to allow the control circuitry to determine whether the AC power system is a single/split phase system or a three phase system and whether the AC power system is connected with a line to line or line to neutral fault condition.

19 Claims, 9 Drawing Sheets

(56) References Cited

U.S. PATENT DOCUMENTS

| | | | |
|---|---|---|---|
| 2015/0188454 A1* | 7/2015 | Noritake | H02J 3/381 363/98 |
| 2015/0207396 A1* | 7/2015 | Ayana | H02M 1/084 363/37 |
| 2016/0091554 A1* | 3/2016 | Fornage | G01R 27/18 324/509 |
| 2016/0121740 A1* | 5/2016 | Zaki | B60L 53/31 320/109 |
| 2017/0179745 A1* | 6/2017 | Tritschler | B60L 53/24 |
| 2019/0184833 A1 | 6/2019 | Elshaer et al. | |
| 2020/0083727 A1* | 3/2020 | Sun | H02J 7/00 |
| 2021/0070185 A1 | 3/2021 | Liu et al. | |
| 2021/0126446 A1* | 4/2021 | Gigante | G01R 31/50 |
| 2021/0221249 A1* | 7/2021 | Ge | H02M 1/4225 |

\* cited by examiner

Single/Split-phase 240V

Three-phase 208V

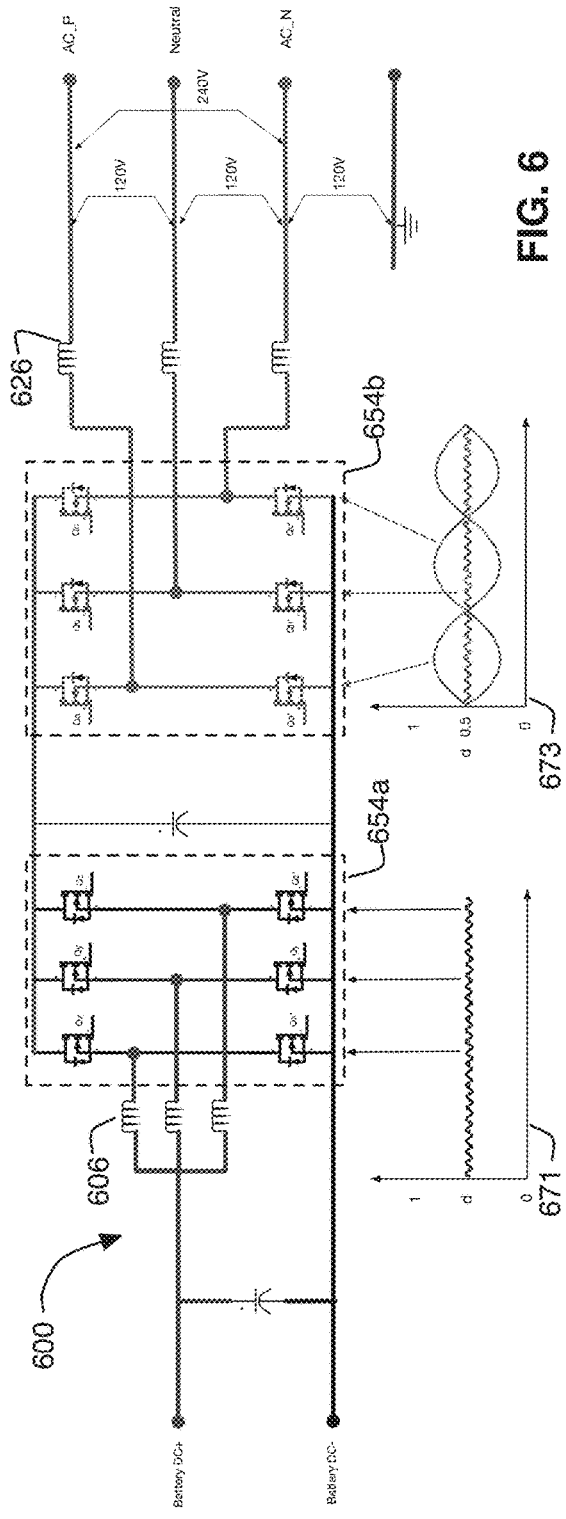
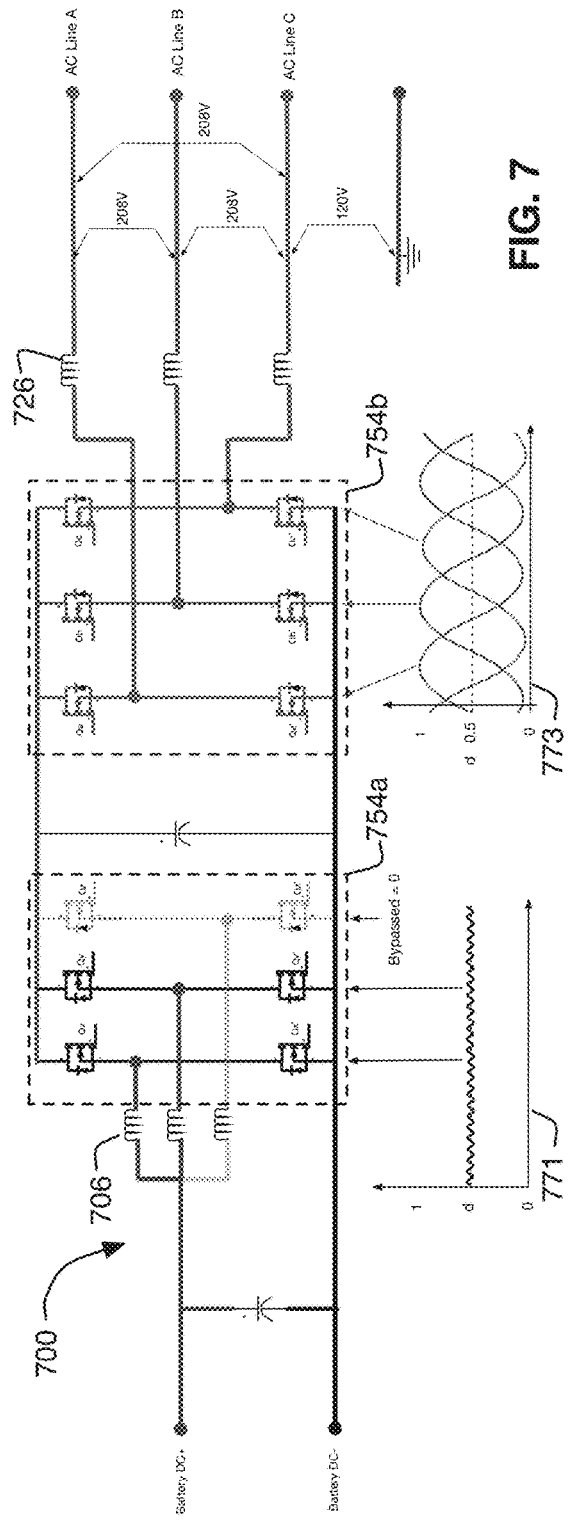
FIG. 6
FIG. 7

AUTO-CONFIGURABLE ENERGY STORAGE SYSTEM

BACKGROUND

Historically mains power grids have been designed with instantaneous equilibrium between the power consumed by all customer loads connected to the grid and the power generated by all generation facilities connected to the grid. Recently, for a variety of reasons, interest in grid-connected energy storage systems has increased. In some cases, these energy storage systems take the form of utility-scale arrangements, including large grid-connected battery banks or other forms of energy storage. In other cases, these energy storage systems take the form of customer-scale configurations, which can include things like (somewhat smaller) battery banks. In general these energy storage systems operate by storing energy in the batteries (or other energy storage devices) at certain times, for example, during the day when solar generation is at its peak or at night when lower prices for conventionally generated electricity may be in effect. Likewise, these systems may discharge their stored energy when appropriate. For example, a system that stores solar energy during the day may discharge that energy at night when solar power is unavailable, or a system that stores cheaper electricity generated overnight may discharge it during the day when higher prices are in effect. Similarly, these energy storage systems may be discharged to continue providing electricity in the event of a power failure.

Many permutations of such energy storage systems are employed depending on the goals of the system and the operation of the local power grid. However, they typically include a bidirectional power converter that can either charge the energy storage devices from the grid or discharge the energy storage devices to the grid. This converter can be operated by a controller that implements the logic necessary to achieve the goals of the system by monitoring things like availability of alternative or cheaper power sources, failure of the grid, etc.

Heretofore, one problem with such arrangements has been the disparate types of power grid connections employed, particularly relating to voltage and phase configuration. In the United States, for example, residential electrical service is typically single phase 240/120Vac. This configuration is also sometimes referred to as split phase, as it is made up of two 120Vac legs and a common neutral, with the two energized legs being 180 degrees out of phase. Thus, the two energized legs provide the 240Vac typically used for high power loads. Conversely, commercial electrical service may be more commonly provided as 208/120V three phase, in which there are three legs energized at 120Vac relative to a common neutral, each 120 degrees out of phase with respect to the others. The line-to-line voltage in this configuration is 208Vac. Other configurations are also in use, including 240V three phase, high-leg 240V three phase, etc.

Up to now, the converter portion of energy storage systems have had to be designed for the particular grid configuration with which they are intended to operate. Thus, for example, separate designs have been required for single phase versus multi-phase systems, which can lead to a variety of drawbacks.

SUMMARY

Thus, it would be advantageous to provide an energy storage system that can automatically detect a configuration of a power system to which it is connected and operate accordingly to generate the required voltage.

A power converter can be configured to couple an energy storage device to an AC power system. The converter can include a DC-DC converter comprising a first plurality of switching devices, with the DC-DC converter being couplable to the energy storage device and coupled to an intermediate DC bus of the power converter. The plurality of switching devices can be operable to deliver energy from the energy storage device to the intermediate DC bus. The converter can also include a DC-AC converter comprising a second plurality of switching devices. The DC-AC converter can be coupled to the intermediate DC bus and couplable to the AC power system. The second plurality of switching devices can be operable to deliver energy from the intermediate DC bus to the AC power system. The power converter can also include control circuitry that determines whether a connected AC power system is a single/split phase system or a three phase system and operates the first and second pluralities of switching devices accordingly.

The first plurality of switching devices can include three legs, each leg having a first switch coupled between a first input terminal couplable to the energy storage device and a high rail of the intermediate DC bus and a second switch coupled between the first input terminal and a low rail of the intermediate DC bus. Each leg can be coupled to the first input terminal by a respective inductor. If the control circuitry determines that the connected AC power system is a single/split phase system, the control circuitry can provide drive signals to the first plurality of switching devices to operate all three legs in an interleaved manner to generate a DC bus voltage of the intermediate DC bus. If the control circuitry determines that the connected AC power system is a three phase system, the control circuitry can provide drive signals to the first plurality of switching devices to operate two legs in an interleaved manner to generate the DC bus voltage of the intermediate DC bus. The drive signals can be PWM signals. The PWM signals can cause each operating leg to operate as a boost converter.

The second plurality of switching devices can include three legs, each leg having a first switch coupled between a high rail of the intermediate DC bus and an output terminal couplable to the AC power system and a second switch coupled between a low rail of the intermediate DC bus and an output terminal couplable to the AC power system. Each leg can be coupled to its respective output terminal by an inductor. If the control circuitry determines that the connected AC power system is a single/split phase system, the control circuitry can provide drive signals to the second plurality of switching devices to operate a first leg to generate a first AC voltage, a second leg to generate a second AC voltage 180 degrees out of phase with respect to the first AC voltage, and a third leg to balance the first and second voltages. If the control circuitry determines that the connected AC power system is a three phase system, the control circuitry can provide drive signals to the first plurality of switching devices to operate each leg to generate an AC voltage that is 120 degrees out of phase with respect to the AC voltage generated by the other two legs. The drive signals can be PWM signals. If the connected AC power system is a single/split phase system, the third leg can be operated intermittently.

An energy storage system can include a DC energy storage device, a power converter comprising a first plurality of switching devices coupled between the DC energy storage device and an intermediate DC bus of the power converter and a second plurality of switching devices coupled between the intermediate DC bus and an AC power system, and control circuitry that determines whether the AC power system is a single/split phase system or a three phase system and operates the first and second pluralities of switching devices accordingly. The DC energy storage device can be a battery. The control circuitry can include a microcontroller. The control circuitry can include a plurality of voltage sensors each configured to monitor a magnitude and a phase of a voltage to allow the control circuitry to determine whether the AC power system is a single/split phase system or a three phase system and whether the AC power system is connected with a line to line or line to neutral fault condition. The plurality of voltage sensors can include a first voltage sensor connected between a first terminal and a second terminal of the AC power system, a second voltage sensor connected between the second terminal and a third terminal of the AC power system, and a third voltage sensor connected between the third terminal and a fourth terminal of the AC power system. For a single/split phase AC system, the first terminal can be a first line terminal, the second terminal can be a neutral terminal, the third terminal can be a second line terminal, and the fourth terminal can be a ground terminal. For a three phase AC system, the first terminal can be a first line terminal, the second terminal can be a second line terminal, the third terminal can be a third line terminal, and the fourth terminal can be a ground terminal.

An energy storage system can include a battery, a power converter comprising a first plurality of switching devices coupled to the battery and a second plurality of switching devices coupled between the first plurality of switching devices and an AC power system, and control circuitry that determines whether the AC power system is a single/split phase system or a three phase system and operates the first and second pluralities of switching devices accordingly. The control circuitry can include a microcontroller and a plurality of voltage sensors each configured to monitor a magnitude and a phase of a voltage to allow the control circuitry to determine whether the AC power system is a single/split phase system or a three phase system and whether the AC power system is connected with a line to line or line to neutral fault condition.

The first plurality of switching devices can include three legs, each leg having a first switch coupled between a first input terminal couplable to the energy storage device and a high rail of an intermediate DC bus and a second switch coupled between the first input terminal and a low rail of the intermediate DC bus. If the control circuitry determines that the connected AC power system is a single/split phase system, the control circuitry can provide drive signals to the first plurality of switching devices to operate all three legs in an interleaved manner to generate a DC bus voltage of the intermediate DC bus. If the control circuitry determines that the connected AC power system is a three phase system, the control circuitry can provide drive signals to the first plurality of switching devices to operate two legs in an interleaved manner to generate the DC bus voltage of the intermediate DC bus. The second plurality of switching devices can include three legs, each leg having a first switch coupled between a high rail of the intermediate DC bus and an output terminal couplable to the AC power system and a second switch coupled between a low rail of the intermediate DC bus and an output terminal couplable to the AC power system. If the control circuitry determines that the connected AC power system is a single/split phase system, the control circuitry can provide drive signals to the second plurality of switching devices to operate a first leg to generate a first AC voltage, a second leg to generate a second AC voltage 180 degrees out of phase with respect to the first AC voltage, and a third leg to balance the first and second voltages. If the control circuitry determines that the connected AC power system is a three phase system, the control circuitry can provide drive signals to the first plurality of switching devices to operate each leg to generate an AC voltage that is 120 degrees out of phase with respect to the AC voltage generated by the other two legs.

The plurality of voltage sensors can include a first voltage sensor connected between a first terminal and a second terminal of the AC power system, a second voltage sensor connected between the second terminal and a third terminal of the AC power system, and a third voltage sensor connected between the third terminal and a fourth terminal of the AC power system. For a single/split phase AC system, the first terminal can be a first line terminal, the second terminal can be a neutral terminal, the third terminal can be a second line terminal, and the fourth terminal can be a ground terminal. For a three phase AC system, the first terminal can be a first line terminal, the second terminal can be a second line terminal, the third terminal can be a third line terminal, and the fourth terminal can be a ground terminal.

BRIEF DESCRIPTION OF THE DRAWINGS

FIG. 6 illustrates switching of an automatically configurable energy storage system in a single phase application.

FIG. 7 illustrates switching of an automatically configurable energy storage system in a three phase application.

DETAILED DESCRIPTION

Figure 1:
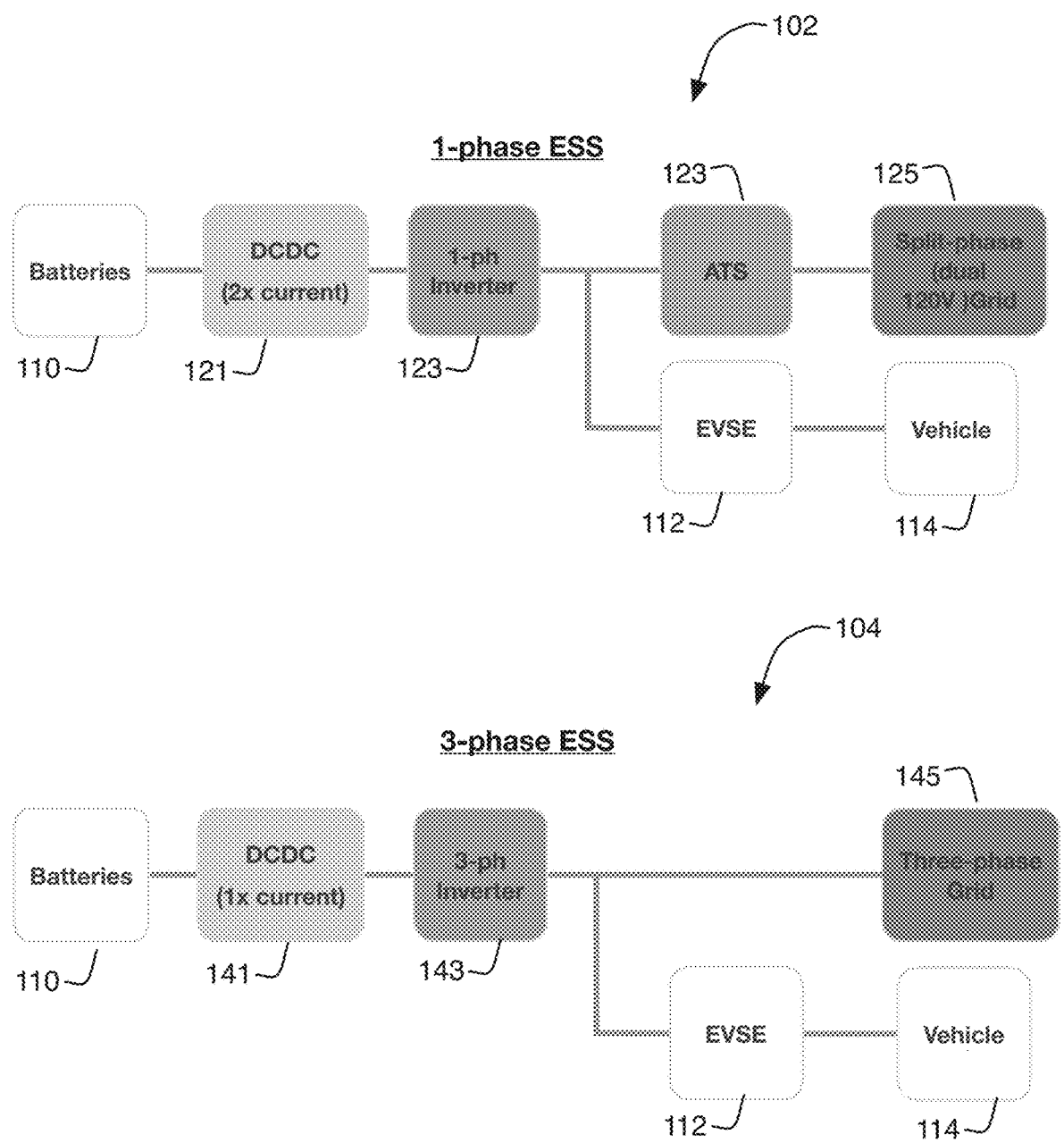
FIG. 1 illustrates block diagrams of single phase and three phase energy storage systems in exemplary applications.

In the following description, for purposes of explanation, numerous specific details are set forth to provide a thorough understanding of the disclosed concepts. As part of this description, some of this disclosure's drawings represent structures and devices in block diagram form for sake of simplicity. In the interest of clarity, not all features of an actual implementation are described in this disclosure. Moreover, the language used in this disclosure has been selected for readability and instructional purposes, has not been selected to delineate or circumscribe the disclosed subject matter. Rather the appended claims are intended for such purpose.

Various embodiments of the disclosed concepts are illustrated by way of example and not by way of limitation in the accompanying drawings in which like references indicate similar elements. For simplicity and clarity of illustration, where appropriate, reference numerals have been repeated among the different figures to indicate corresponding or analogous elements. In addition, numerous specific details are set forth in order to provide a thorough understanding of the implementations described herein. In other instances, methods, procedures and components have not been described in detail so as not to obscure the related relevant function being described. References to "an," "one," or "another" embodiment in this disclosure are not necessarily to the same or different embodiment, and they mean at least one. A given figure may be used to illustrate the features of more than one embodiment, or more than one species of the disclosure, and not all elements in the figure may be required for a given embodiment or species. A reference number, when provided in a given drawing, refers to the same element throughout the several drawings, though it may not be repeated in every drawing. The drawings are not to scale unless otherwise indicated, and the proportions of certain parts may be exaggerated to better illustrate details and features of the present disclosure.

FIG. 1 illustrates block diagrams of single phase and three phase energy storage systems in exemplary applications. More specifically, block diagram 102 illustrates a single phase energy storage system, and block diagram 104 illustrates a three phase energy storage system. In the single phase energy storage system 102, energy is stored in a battery bank 110. A DC-DC converter 121 may convert the battery voltage to a suitable input voltage for single phase inverter 123, which generates an AC voltage compatible with the connected electrical system. As one example, DC-DC converter 121 may be a boost converter that boosts or steps-up the battery voltage to a higher value. It will be appreciated that DC-DC converter should be designed with a maximum current carrying capacity equal to 2× the line current of the AC power system (because of the battery ripple current occurring at 2× the line frequency, e.g., 60 Hz for North American applications). As noted above, single phase inverter 123 may take the output of DC-DC converter 121 and generate an AC voltage suitable for powering the connected loads. As an example, in the illustrated embodiment, single phase inverter 123 may be coupled via an automatic transfer switch 123 to the premises electrical grid, in this case a split phase 240/120Vac grid 125. Additionally, the inverter output may be connected to high power loads, illustrated in the given example as an electric vehicle 114, which is connected via electric vehicle supply equipment (EVSE) 112. (As an aside, it will be appreciated that inverter 123 and DC-DC converter 121 may also be operated in reverse to charge batteries 110 from the grid as appropriate. However, the discussion herein will be focused on supply from the energy storage system.)

In the three phase energy storage system 104, energy is stored in a battery bank 110. A DC-DC converter 141 may convert the battery voltage to a suitable input voltage for three phase inverter 143, which generates an AC voltage compatible with the connected electrical system. As one example, DC-DC converter 141 may be a boost converter that boosts or steps-up the battery voltage to a higher value. It will be appreciated that in the three phase embodiment DC-DC converter 141 need only carry the rated line current. As noted above, three phase inverter 143 may take the output of DC-DC converter 121 and generate an AC voltage suitable for powering the connected loads. As an example, in the illustrated embodiment, three phase inverter 143 may be coupled directly to the three phase 208/120Vac premises electrical grid 145 (omitting the ATS 123 above). Additionally, the inverter output may be connected to high power loads, illustrated in the given example as an electric vehicle 114, which is connected via electric vehicle supply equipment (EVSE) 112. (As an aside, it will be appreciated that inverter 143 and DC-DC converter 141 may also be operated in reverse to charge batteries 110 from the grid as appropriate. However, the discussion herein will be focused on supply from the energy storage system.)

Figure 2:
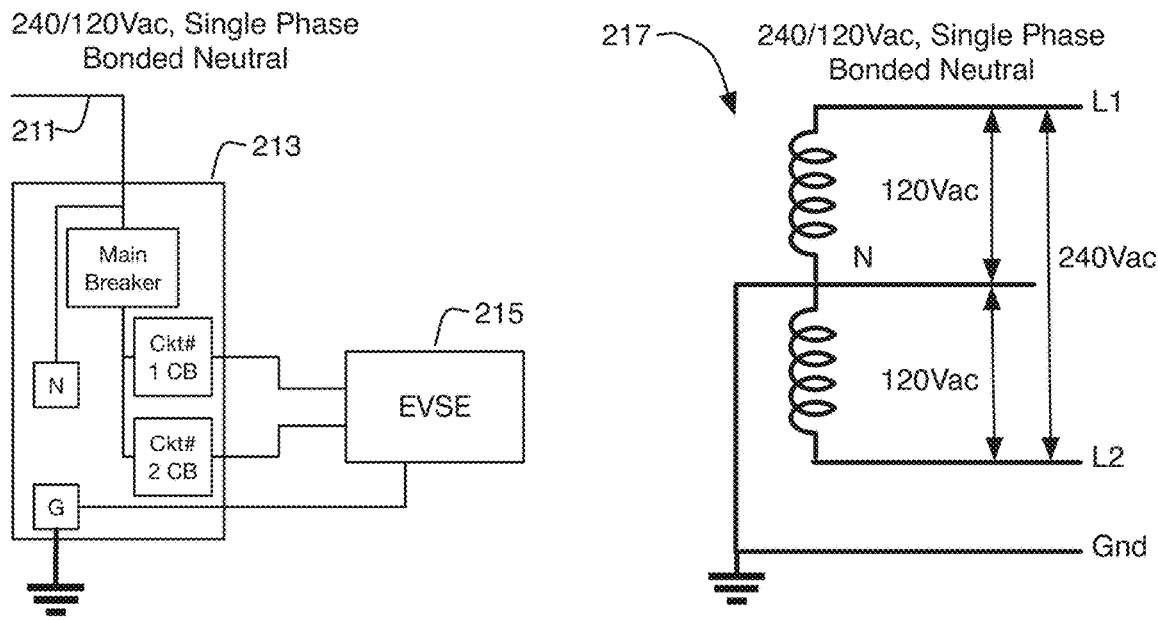
FIG. 2 illustrates exemplary wiring diagrams for high power loads, such as electric vehicle charging.
Figure 2:
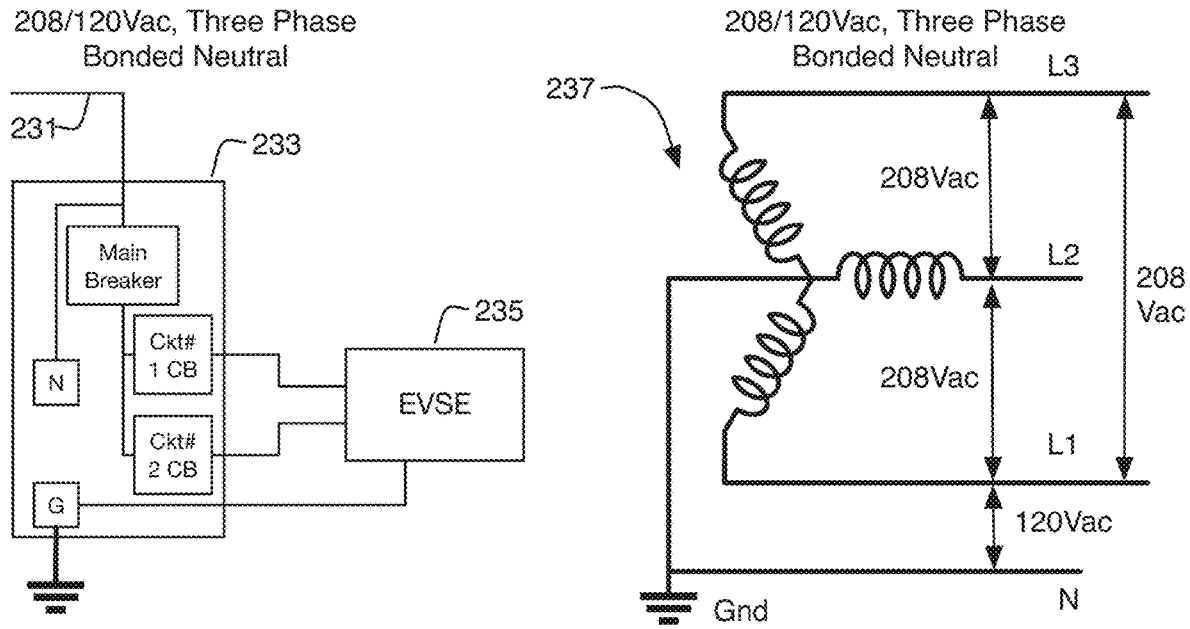

FIG. 2 illustrates exemplary wiring diagrams for high power loads, such as the electric vehicle chargers described above. In the upper portion of the diagram, a single/split phase system is depicted. A single/split phase service 211 is provided to a single phase panel 213. Vehicle charging equipment 215, which can accommodate charging two electric vehicles, is coupled between the two energized lines L1, L2, providing 240Vac to these higher power loads. Low power loads (not shown) may be connected to either of the energized lines L1, L2 and the incoming neutral (NEU). Simplified schematic 217 illustrates this arrangement, in which the high power loads (e.g., vehicle chargers) are both connected between the energized lines L1, L2, thereby receiving 240Vac; and low power loads are connected between one of the energized lines L1, L2 and the neutral NEU, thereby receiving 120Vac.

In the upper portion of FIG. 2, a three phase system is depicted. A three phase service 231 is provided to a three phase panel 233. Vehicle charging equipment 235, which can accommodate charging two electric vehicles, is coupled between the three energized lines L1, L2, L3 providing 240Vac to these higher power loads. More specifically, a first high power load may be connected between energized lines L1 and L2, and a second high power load may be connected between energized lines L2 and L3. Low power loads (not shown) may be connected to any one of the energized lines L1, L2, L3 and the neutral (NEU). Simplified schematic 237 illustrates this arrangement, in which the high power loads (e.g., vehicle chargers) are connected between different phases of the energized lines L1, L2, L3, thereby receiving 240Vac; and low power loads are connected between one of the energized lines L1, L2, L3 and the neutral NEU, thereby receiving 120Vac.

Figure 3:
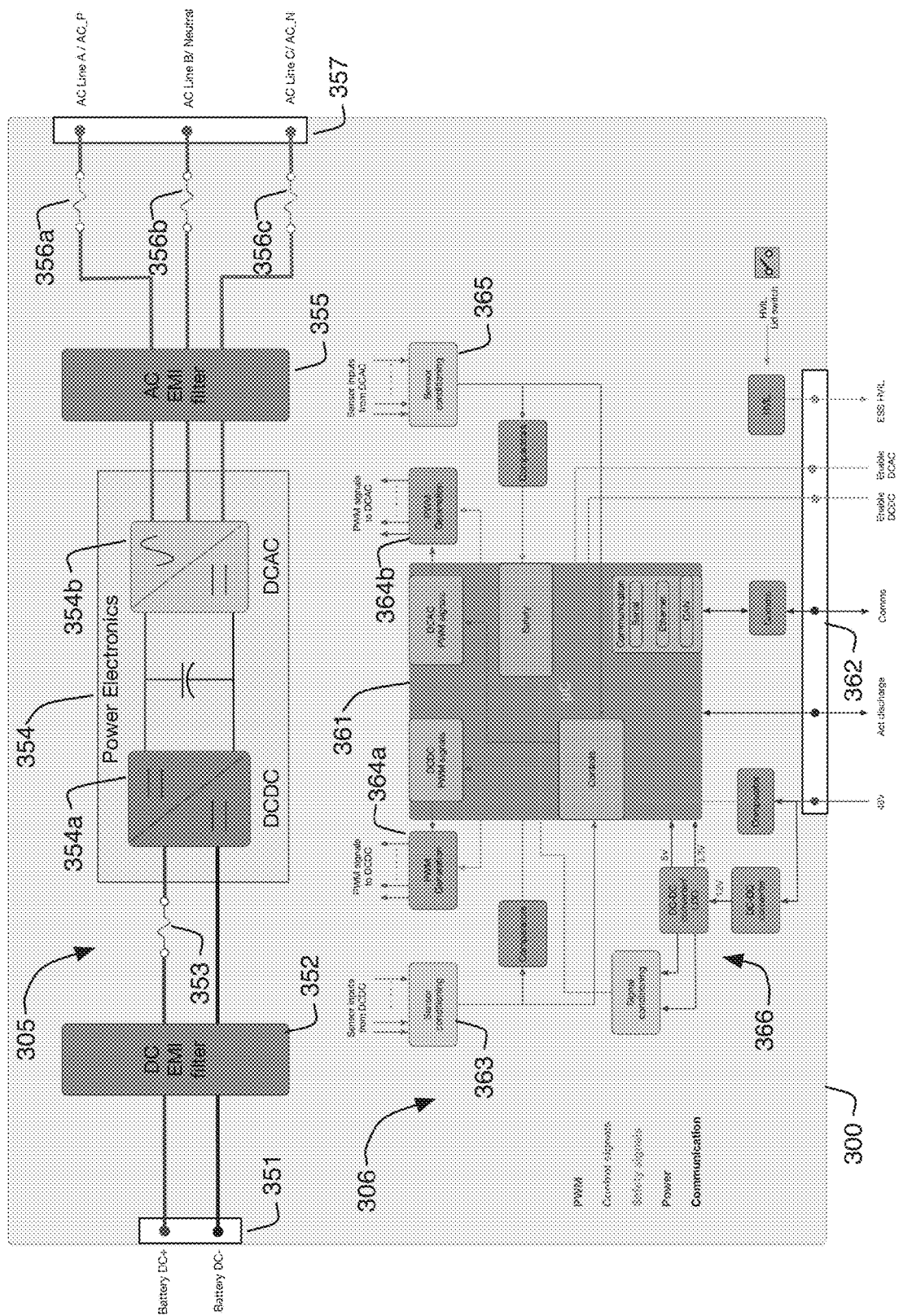
FIG. 3 illustrates a block diagram of an automatically configurable energy storage system for use with either single phase or three phase electrical systems.

FIG. 3 illustrates a block diagram of an automatically configurable energy storage system for use with either single phase or three phase electrical systems. The upper portion of the block diagram illustrates the power stage 305, and the lower portion of the block diagram illustrates the control circuitry 306. Turning first to power stage 305, input power may be received via battery terminals 351, which may be coupled to respective positive and negative DC terminals of the battery. (As noted above, power may also be delivered to the battery via these terminals, but the following description assumes the alternative case in which the battery is discharged to provide AC power to the connected loads.) The battery power may pass through an electromagnetic interference (EMI) filter 352 and an overcurrent protection device 353 to arrive at converter 354. Converter 354 may be a power electronics circuit as described in greater detail below that includes a DC-DC converter stage 354a and a DC-AC inverter stage 354b coupled by a DC bus. The output of DC-AC inverter 354b may pass through a second electromagnetic interference (EMI) filter 355 and overcurrent protective devices 356a, 356b, and 356c before being provided to output terminals 357. Output terminals 357 may provide the required single/split phase or a three phase output as described in greater detail below.

Control circuitry 306 may be based around a microcontroller 361. Microcontroller 361 can include circuitry and/or programming that receives conditioned sensor inputs 363 from the DC-DC side and conditioned sensor inputs 365 from the DC-AC side. These and other optional inputs may be used by the circuitry and programming of controller 361 to generate PWM signals 364a to drive the switches of DC-DC converter 354a and to generate PWM signals 364b to drive the switches of DC0AC converter 354b. Controller 361 can also include circuitry and/or programming that performs other functions, including various safety functions such as disabling the converter in the case of various fault conditions. Controller 361 can also include circuitry and/or programming to provide a communication interface with other devices, including devices for providing a user interface indicating status, operating mode, and the like to a user of the system. Also depicted in FIG. 3 is power conditioning circuitry 366 that can provide regulated power for the various components of controller circuitry 306 and comms terminals 362 that serve as the interface with various other devices. The controller circuitry 306 illustrated in FIG. 3 is but one, high-level example, and it is to be understood that many possible implementations of such controller circuitry may be provided depending on the particulars of a given application. Additionally, although illustrated as being based on a microcontroller 361, other arrangements are also possible based on any combination of analog, digital, hybrid analog/digital circuitry, other programmable devices such as microprocessors, application specific integrated circuits (ASICs), or the like.

Figure 4:
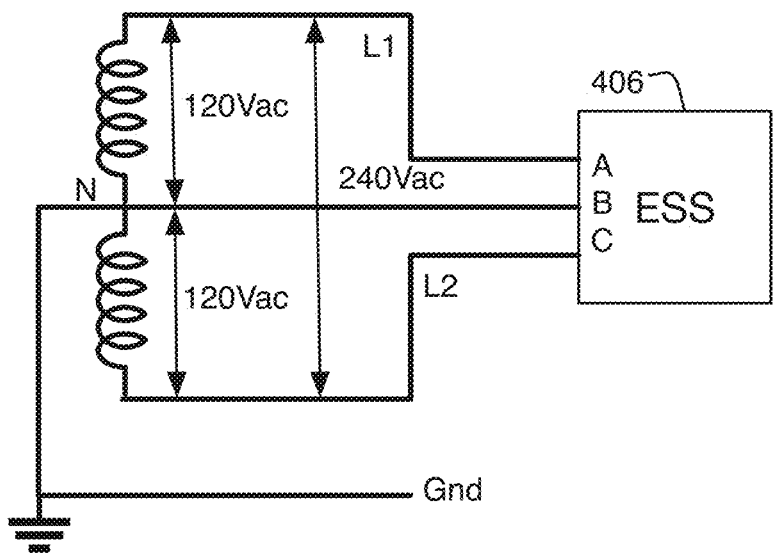
FIG. 4 illustrates connection of an automatically configurable energy storage system to either a single phase or a three phase electrical system.
Figure 4:
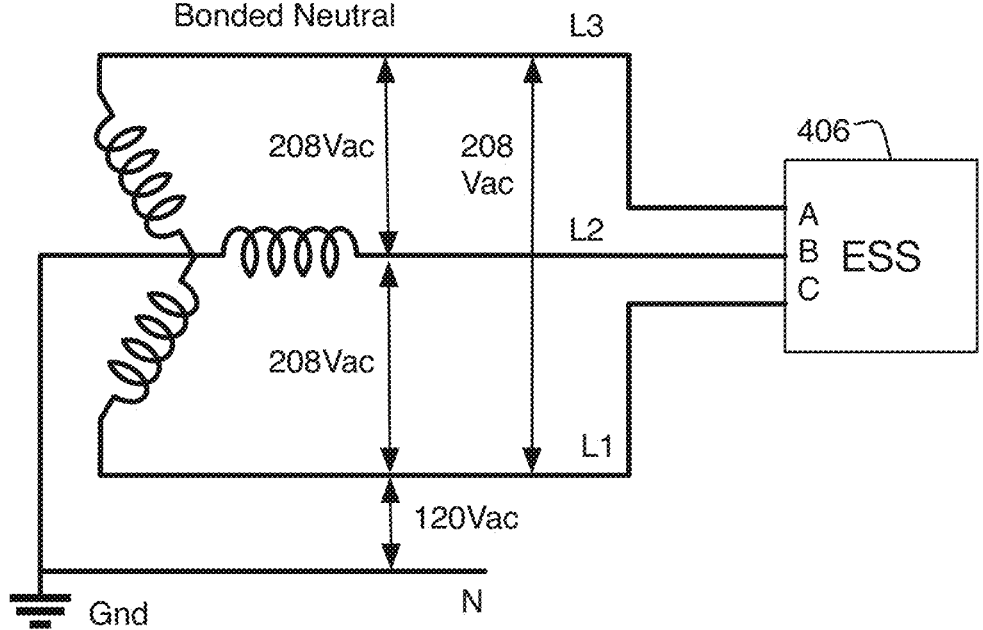

FIG. 4 illustrates connection of an automatically configurable energy storage system to either a single phase or a three phase electrical system. More specifically, in the upper portion of FIG. 4, energy storage system 406 is in a single/split phase configuration, with its three output lines A, B, C (see, e.g., terminals 357 in FIG. 3) connected to energized line L2, neutral NEU, and energized line L1, respectively, of the grid system. In the lower portion of FIG. 4, energy storage system 407 is in a three phase configuration, with its three output liens A, B, C (see, e.g., terminals 357 in FIG. 3) connected to lines L3, L2, and L1, respectively, of the grid system. In this latter case, the neutral is not connected to the neutral, although the neutral is bonded to ground.

Figure 5:
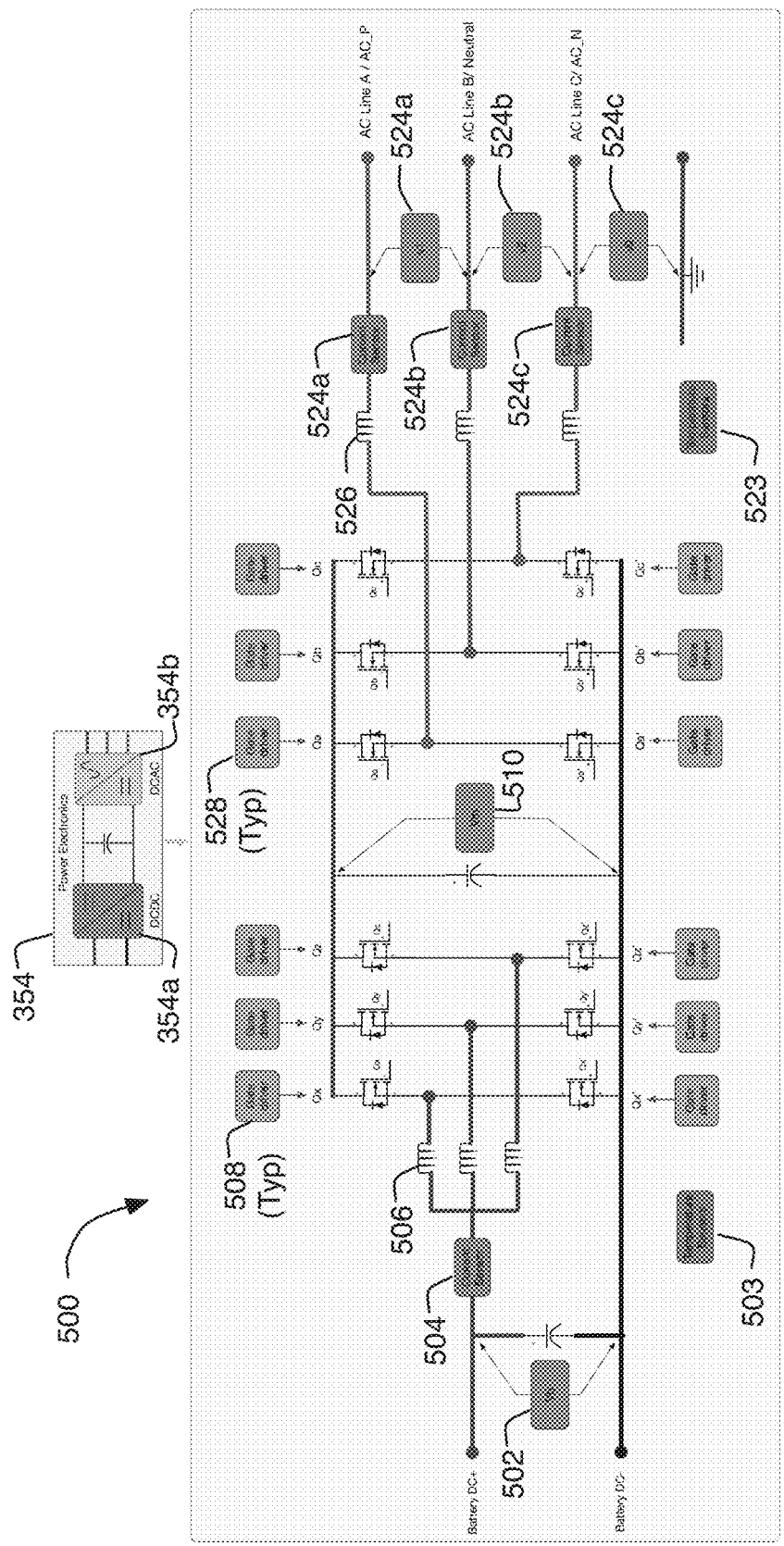
FIG. 5 illustrates a simplified schematic of an automatically configurable energy storage system.

FIG. 5 illustrates a simplified schematic of converter stage 354, described above with respect to FIG. 3, including DC-DC stage 354a and DC-AC stage 354b. More specifically, energy storage system 500 receives DC power from a battery bank via the Battery DC+ and Battery DC− terminals. (As discussed above, the illustrated circuitry is bidirectional, and thus may also be used for battery charging, although the following description focuses on the discharging configuration/mode of operation.) This voltage is monitored by a battery voltage sensor 502, and may also be applied across a filter capacitor. Additionally, current from the battery may be monitored by current sensor 504. Current drawn from the battery passes through inductors 506, each of which is coupled to a switch leg comprising an upper switch Qx, Qy, Qz and a lower switch Qx', Qy', Qz'. Each of these switches may be driven by a respective gate driver 508, that receives PWM signals generated by the control system as described above with respect to FIG. 3. For example, switch pairs Qx/Qx', Qy/Qy', and Qz/Qz', in conjunction with corresponding inductors 506 may be operated as boost converters to step up the battery voltage to the intermediate DC bus voltage, which is monitored by voltage sensor 510. This voltage may also be supported by a DC bus capacitor, as illustrated.

Also coupled to the intermediate DC bus is DC-AC switching stage 354b, also made up of three switch legs, each including a high side switch Qa, Qb, Qc and a low side switch Qa', Qb', Qc'. Each of these switches may be driven by a respective gate driver 528, that receives PWM signals generated by the control system as described above with respect to FIG. 3. For example, switch pairs Qa/Qa', Qb/Qb', and Qc/Qc' may operate as inverters to generate an AC voltage supplied via filter inductors 526 to the AC terminals of the energy storage system. The respective output currents may be monitored by current sensors 524a, 524b, and 524c, and the voltage between the respective lines and the AC neutral may be monitored by voltage sensors 524a, 524b, 524c. As described in greater detail below with respect to FIG. 6, the DC-AC switches may be operated to generate a single/split phase output. Alternatively, as described in greater detail below with respect to FIG. 7, the DC-AC switches may be operated to generate a three phase output.

Also included in FIG. 5 are DC-DC side temperature sensors 503 and DC-AC side temperature sensors 523, which may provide their inputs to control circuitry 306 to allow for overtemperature detection. Control circuitry 306 may be configured to respond to such overtemperature conditions and modify operation of the circuitry as appropriate to prevent damage.

FIG. 6 illustrates switching of an automatically configurable energy storage system 600 in a single phase application. As described above, power from the battery may be received via the Battery DC+ and Battery DC− input terminals. Switching arrangement 654a in combination with inductors 606 may operate as a DC-DC converter to convert the battery voltage to the intermediate DC bus voltage. As noted above, this may be a step-up or boost operation. In that case, inductors 606 operate as boost inductors, low side switches Qx', Qy', and Qz' can operate as the boost switches, and high side switches Qx, Qy, and Qz can operate as synchronous rectifier switches for the boost converter output.

In the single phase mode, all three legs of switching arrangement 654a may be operated in an interleaved fashion to provide for the peak currents associated with the 2× line frequency (e.g., 120 Hz) ripple. Corresponding PWM drive signals to achieve this mode of operation may be provided by the controller as described above with respect to FIG. 3. Plot 671 indicates the duty cycle of the respective switching devices of switching arrangement 654a. More specifically, the system can be designed so that converting the nominal battery voltage to the desired DC bus voltage requires a predetermined duty cycle d, with slight fluctuations as required for variations in battery voltage and/or load on the system. (It will be appreciated that switching arrangement 654a together with inductors 606 may also be operated in the reverse direction, e.g., as a buck converter, to charge the battery from the intermediate DC bus.)

Turning to the left side of FIG. 6, switching arrangement 654b may be operated as an inverter to generate the desired 240/120V single/split phase voltage (or any other desired single phase voltage). In this mode, two legs of the inverter (e.g., legs a and c) may be driven 180 degrees out of phase to produce the respective 120Vac line to neutral voltages 180 degrees out of phase with each other. The third inverter leg may be connected to the neutral, with the switches of this leg (e.g., leg b) being operated intermittently as required to maintain voltage balance between the two high legs. Corresponding PWM drive signals to achieve this mode of operation may be provided by the controller as described above with respect to FIG. 3. Plot 673 indicates the duty cycle of the respective switching devices of switching arrangement 654b. More specifically, the a leg may be driven with a sinusoidally varying duty cycle generally corresponding to the first 120V leg's voltage. Similarly, the c leg may be driven with a sinusoidally varying duty cycle generally corresponding to the second 120V leg's voltage. The b leg may be driven with a roughly 50% duty cycle, although, as noted above, operation of the b leg may be intermittent so that it only operates when balancing of the two anti-phase 120V legs is required. (It will be appreciated that switching arrangement 654b together with inductors 626 may also be operated in the reverse direction, e.g., as controlled rectifier or other converter, to produce an intermediate bus voltage that may be used to charge the battery.)

The above-described operation of converter 600 can produce the desired single/split phase voltage at the output terminals, namely such that line AC_P has a 120Vac voltage relative to the neutral, and line AC_N has a 120Vac voltage relative to the neutral that is 180 degrees out of phase relative to the AC_P voltage. As a result, there will be a 240Vac difference between lines AC_P and AC_N. Additionally, bonding of the neutral to ground means that the AC_P and AC_N voltages will also be 120Vac relative to ground.

FIG. 7 illustrates switching of an automatically configurable energy storage system 700 in a three phase application. As described above, power from the battery may be received via the Battery DC+ and Battery DC− input terminals. Switching arrangement 754a in combination with inductors 706 may operate as a DC-DC converter to convert the battery voltage to the intermediate DC bus voltage. As noted above, this may be a step-up or boost operation. In that case, inductors 706 operate as boost inductors, low side switches Qx', Qy', and Qz' can operate as the boost switches, and high side switches Qx, Qy, and Qz can operate as synchronous rectifier switches for the boost converter output.

In the three phase mode, only two legs of switching arrangement 754a need be operated in an interleaved fashion, as it is not necessary to provide for the peak currents associated with the 2× line frequency (e.g., 120 Hz) ripple because this ripple is cancelled out in the three phase mode. Alternatively, if desired, the third leg can be used in parallel to reduce the per-leg current and potentially increase efficiency due to reduced conduction losses. Corresponding PWM drive signals to achieve either of these modes of operation may be provided by the controller as described above with respect to FIG. 3. Plot 771 indicates the duty cycle of the respective switching devices of switching arrangement 754a. More specifically, the system can be designed so that converting the nominal battery voltage to the desired DC bus voltage requires a predetermined duty cycle d, with slight fluctuations as required for variations in battery voltage and/or load on the system. (It will be appreciated that switching arrangement 754a together with inductors 706 may also be operated in the reverse direction, e.g., as a buck converter, to charge the battery from the intermediate DC bus.)

Turning to the left side of FIG. 7, switching arrangement 754b may be operated as an inverter to generate the desired 208Vac three phase voltage (or any other desired three phase voltage). In this mode, each of the three legs of the inverter may be driven 120 degrees out of phase with respect to each other to produce the respective 208Vac line-to-line voltage. Corresponding PWM drive signals to achieve this mode of operation may be provided by the controller as described above with respect to FIG. 3. Plot 773 indicates the duty cycle of the respective switching devices of switching arrangement 754b. More specifically, the a leg may be driven with a sinusoidally varying duty cycle generally corresponding to the first 208Vac line-to-line voltage. Similarly, the b leg may be driven with a sinusoidally varying duty cycle generally corresponding to the second 208Vac line voltage, lagging the first leg by 120 degrees. Finally, the c leg may be driven with a sinusoidally varying duty cycle generally corresponding to the third 208Vac line voltage, lagging the second leg by 120 degrees. (It will be appreciated that switching arrangement 754b together with inductors 726 may also be operated in the reverse direction, e.g., as controlled rectifier or other converter, to produce an intermediate bus voltage that may be used to charge the battery.)

The above-described operation of converter 700 can produce the desired three phase voltage at the output terminals, namely such AC Line A, AC Line B, and AC Line C each have a 208Vac voltage between the other legs. Additionally, although the neutral is not connected to the inverter, bonding of the neutral to ground means that the generated AC voltages will be 120Vac relative to neutral (and ground).

Figure 8:
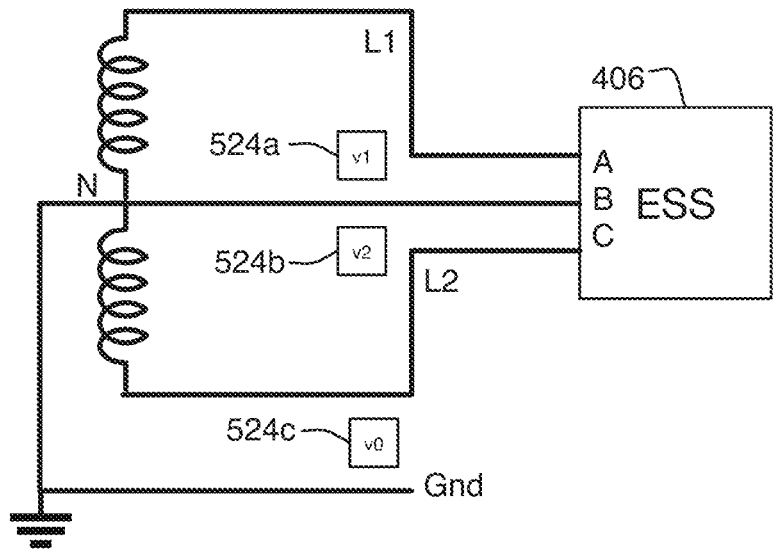
FIG. 8 illustrates a single phase detection arrangement for an automatically configurable energy storage system.

As noted above, it may be desirable for an energy storage system as described above to automatically determine whether it is connected to a single/split phase system or to a three phase system, so that it can adopt its switching control algorithms to achieve the various desired operating modes described above. This may achieved through use of the voltage sensors 524a, 524b, and 524c described above. More specifically, FIG. 8 illustrates a single phase detection arrangement for an automatically configurable energy storage system. The voltage sensors 524a, 524b, and 524c may be configured as described above with reference to FIG. 5. As a result, sensor 524a monitors an AC voltage v1 (including its magnitude and phase) that, in the single/split phase case is the L2 line to neutral voltage/phase. Similarly, sensor 524b monitors an AC voltage v2 (including its magnitude and phase) that, in the single/split phase case is the L1 line to neutral voltage and phase. Finally, voltage sensor 524c monitors an AC voltage v0 that, in the single/split phase case, is the L1 to ground voltage and phase.

The table in the lower portion of FIG. 8 depicts the various conditions that are indicative of either a good single phase connection (first column) or a faulted connection such as a line to line short (second column) or a line to neutral short (third column). Thus, the magnitude of each voltage v1, v2, and v0 is equal and equal to the line to neutral voltage (e.g., 120V), and the phase of v1 is the opposite of v2, which is the opposite of v0, and none of them are zero, then there is a good single phase connection at the output of energy storage system 406. Conversely, if the magnitude of any of v1, v2, or v0 is zero, then a line-to-line fault is indicated. Likewise, if the phase relationship between v1 and v2 is zero, then a line-to-line fault is indicated. Also, if the magnitude of v1 is zero and the magnitude of v2 and v0 are equal and equal to the line-to-neutral voltage), then an L2 line to neutral short is indicated. Or, if the magnitude of v1 is equal to the line to neutral voltage (e.g., 120V) and the magnitude of v2 is equal to the magnitude of v0 or is equal to zero, then an L1 to neutral short is indicated. Also, if the phase of v1 is zero and the phase of v2 and v0 is not zero, then an L2 to neutral short is indicated. Finally, if the phase of v1 is not zero, but the phase of v2 and v0 is zero, then an L1 short to neutral is indicated.

Figure 9:
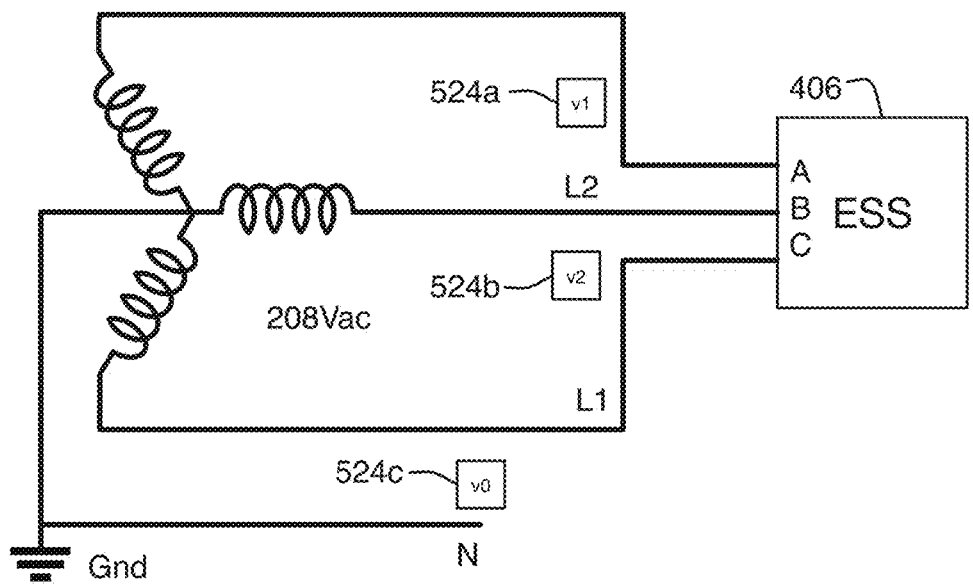
FIG. 9 illustrates a three phase detection arrangement for an automatically configurable energy storage system.

FIG. 9 illustrates a three phase detection arrangement for an automatically configurable energy storage system 407.

The voltage sensors 524*a*, 524*b*, and 524*c* may be configured as described above with reference to FIG. 5. As a result, sensor 524*a* monitors an AC voltage v1 (including its magnitude and phase) that, in the single/split phase case is the L2 line to neutral voltage and phase. Similarly, sensor 524*b* monitors an AC voltage v2 (including its magnitude and phase) that, in the single/split phase case is the L1 line to neutral voltage and phase. Finally, voltage sensor 524*c* monitors an AC voltage v0 that, in the single/split phase case, is the L1 to ground voltage and phase.

The table in the lower portion of FIG. 9 depicts the various conditions that are indicative of either a good three phase connection (first column) or a faulted connection such as a line to line short (second column) or a line to neutral short (third column). Thus, the magnitude of voltages v1 and v2 are equal (and equal to the three phase line-to-line voltage, e.g., 208V), and the magnitude of v0 9s equal to the line to neutral voltage (e.g., 120V), then there is a good single phase connection at the output of energy storage system 406. Likewise, if the phase relationship between v1 and v2 is +/−120 degrees and the phase relationship between v2 and v0 is +/−30 degrees, then a good three phase connection is indicated.

The fault test logic for the three phase case is slightly more complex than the single/split phase case. More specifically, for line to line faults, if the magnitude of v1 is zero and the magnitude of v2 is equal to the line voltage (e.g., 208V) and v0 is equal to the line to neutral voltage, then an L3-L2 line to line short is indicated. Alternatively, if the magnitude of v1 is equal to the line voltage (e.g., 208V) and the magnitude of v2 and v0 are equal to zero, then an L2-L1 line to line short is indicated. Also, if the magnitude of v1 is equal to the magnitude of v2 and is equal to the line voltage (e.g., 208V), but the magnitude of v0 is equal to the line to neutral voltage (e.g., 120V), then an L1 to L3 short is indicated. With respect to the phase relationships for detecting three phase line to line faults, if the phase of v1 is zero and the phase of v2 and v0 are equal and not equal to zero, then and L3-L2 short is indicated. If the phase of v2 is zero and the phase of v1 and v0 are equal and non-zero, then an L2-L1 short is indicated. If the phase of v1 is zero and the phase of v2 and v0 are equal and non-zero, but opposite the value described above for an L3-L2 short, then an L1-L3 short is indicated.

For line to neutral faults, if the magnitude of v1 is equal to the magnitude of v0 and is equal to the line to neutral voltage (e.g., 120V), and the magnitude of v2 is equal to the line voltage (e.g., 208V), then an L3 to neutral short is indicated. If the magnitude of v1 is equal to the magnitude of v2 and the magnitude of v0 and is equal to the line to neutral voltage (e.g., 120V), then an L2 to neutral short is indicated. If the magnitude of v1 is equal to the line to neutral voltage (e.g., 208V), and the magnitude of v2 is equal to the line to neutral voltage (e.g., 120V) and the magnitude of v0 is 0 than an L1 to neutral short is indicated. As for the phase relationships, if the phase of v1 is equal to the phase of v2+/−150 degrees and the phase of v2 is equal to the phase of v0+/−30 degrees, then an L3 to neutral short is indicated. If the phase of v1 is equal to the phase of v2+/−120 degrees and the phase of v2 is equal to the phase of v0 or the negative of the phase of 0, then an L2 to neutral short is indicated. Finally, if the phase of v1 is equal to the phase of v2+/−150 degrees and the phase of v0 is equal to zero, then an L1 to neutral short is indicated.

Figure 10:
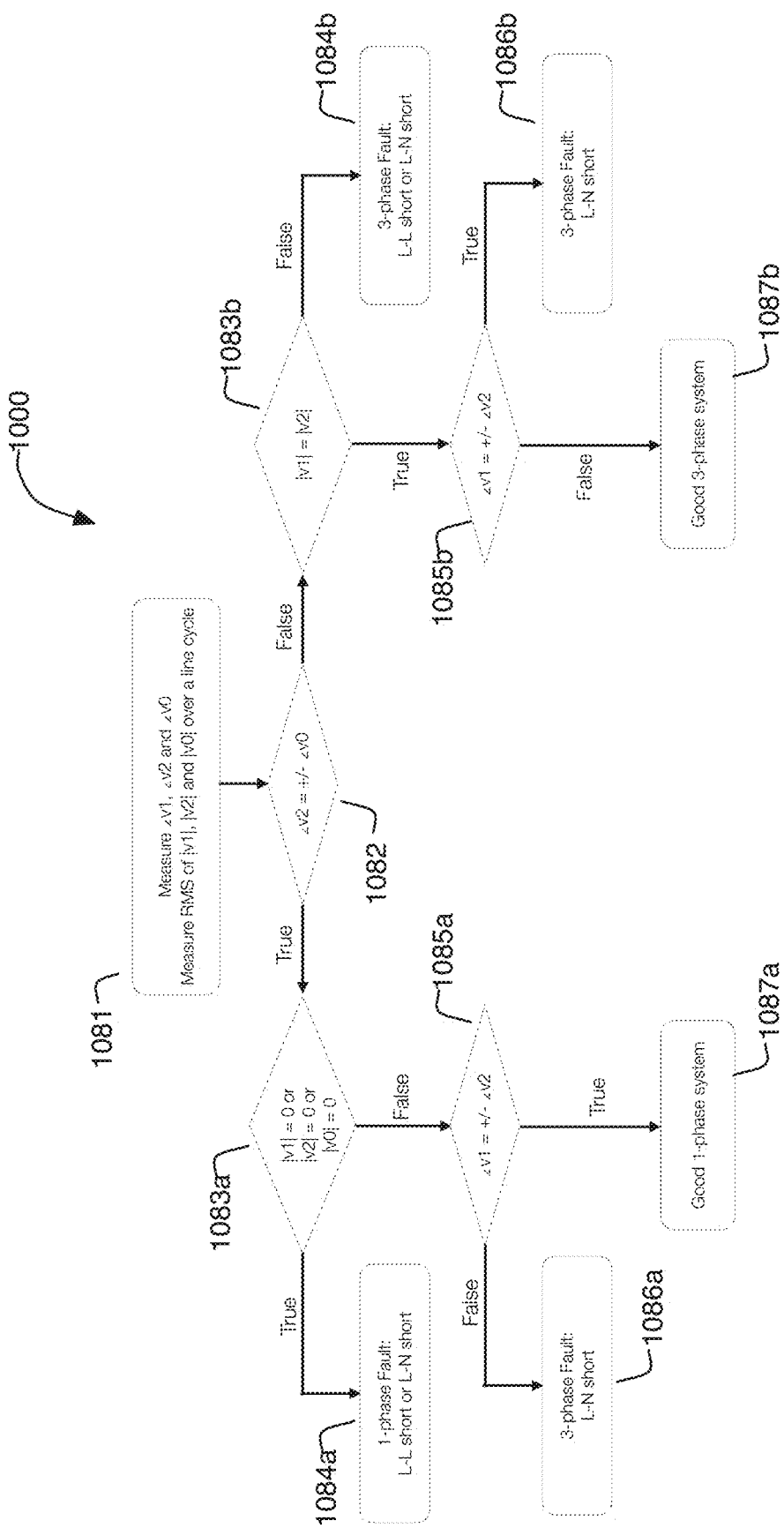
FIG. 10 illustrates a flow chart of a phase and fault detection arrangement for an automatically configurable energy storage system.

FIG. 10 illustrates a flow chart of a phase and fault detection technique 1000 for an automatically configurable energy storage system. This flow chart may be implemented, for example, as programming and/or circuitry in an energy storage control system as described above with respect to FIG. 3. This phase and fault detection arrangement is based on the phase and fault conditions described above with respect to FIGS. 8 and 9. The technique begins at block 1081 with the measurement of the phase angles of the v1, v2, and v0 voltages from sensors positioned as described above. Likewise, the magnitudes (e.g., RMS magnitudes) of v1, v2, and v0 are measured over at least one full line cycle. Then, in block 1082, it may be determined if the phase of v2 is equal to +/− the phase of v0. If so, then the technique branches left to block 1083*a*. If not, then the technique branches right to block 1083*b*.

In block 1083*a*, it may be determined whether the magnitude of v1, v2, or v0 is zero. If so, then a single phase system with a line to line or line to neutral fault is indicated (block 1084*a*). In this case, operation of the energy storage system may be inhibited, and appropriate indication of the error, such as illuminated fault code indications or other feedback may be provided. Alternatively, if, in block 1083*a*, none of the v1, v2, or v0 magnitudes are zero, it may be determined if the phase of v1 is equal to the positive or negative of the phase of v2. If not, then a three phase system with a line to neutral short is indicated (block 1086*a*), and system operation may be inhibited and/or appropriate indication of the fault may be provided. Otherwise, a good (i.e., not faulted) single phase system is indicated block 1087*a*, and normal operation of the energy storage system may be permitted.

Turning back to block 1083*b*, after it is determined whether the phase of v2 is equal to the positive or the negative of the phase of v0 (block 1082), block 1083*b* may determine whether the magnitude of v1 is equal to the magnitude of v2. If not, then a three phase system with a line to line or line to neutral short is indicated (block 1084*b*), and operation of the system may be inhibited and/or indication of the fault may be provided. Otherwise, in block 1085*b*, it may be determined whether the phase of v1 is equal to the positive or negative of the phase of v2. If so, then a three phase system with a line to neutral short is indicated (block 1086*b*) and operation of the energy storage system may be inhibited and/or an indication of the fault may be provided. Otherwise, a good (i.e., non-faulted) three phase system is indicated (block 1087*b*), and normal operation of the energy storage system may be permitted.

Described above are various features and embodiments relating to energy storage systems suitable for use with either single phase or three phase installations. Such circuits may be used in a variety of applications but may be particularly advantageous when used in conjunction with other modern electrical installations such as renewable energy sources, electrical grids with variable pricing based on demand or time of day, and vehicle charging systems. Additionally, although numerous specific features and various embodiments have been described, it is to be understood that, unless otherwise noted as being mutually exclusive, the various features and embodiments may be combined various permutations in a particular implementation. Thus, the various embodiments described above are provided by way of illustration only and should not be constructed to limit the scope of the disclosure. Various modifications and changes can be made to the principles and embodiments herein without departing from the scope of the disclosure and without departing from the scope of the claims.

The invention claimed is:

1. A power converter configured to couple an energy storage device to an AC power system, the converter comprising:
 a DC-DC converter comprising a first plurality of switching devices, the DC-DC converter being couplable to the energy storage device and coupled to an intermediate DC bus of the power converter, wherein the plurality of switching devices are operable to deliver energy from the energy storage device to the intermediate DC bus;
 a DC-AC converter comprising a second plurality of switching devices, the DC-AC converter being coupled to the intermediate DC bus and couplable to the AC power system, wherein:
  the second plurality of switching devices are operable to deliver energy from the intermediate DC bus to the AC power system;
  the second plurality of switching devices comprises three legs, each of the three legs corresponding to the second plurality of switching devices having a first switch coupled between a high rail of the intermediate DC bus and an output terminal couplable to the AC power system and a second switch coupled between a low rail of the intermediate DC bus and an output terminal couplable to the AC power system; and
 control circuitry that determines whether a connected AC power system is a single/split phase system or a three phase system and operates the first and second pluralities of switching devices accordingly, wherein:
  if the control circuitry determines that the connected AC power system is a single/split phase system, the control circuitry provides drive signals to the second plurality of switching devices to operate a first leg to generate a first AC voltage, a second leg to generate a second AC voltage that is 180 degrees out of phase with respect to the first AC voltage, and a third leg to balance the first and second voltages.

2. The power converter of claim 1 wherein the first plurality of switching devices comprises three legs, each leg having a first switch coupled between a first input terminal couplable to the energy storage device and a high rail of the intermediate DC bus and a second switch coupled between the first input terminal and a low rail of the intermediate DC bus.

3. The power converter of claim 2 wherein each of the three legs correspond to the first plurality of switching devices is coupled to the first input terminal by a respective inductor.

4. The power converter of claim 2 wherein:
 if the control circuitry determines that the connected AC power system is a single/split phase system, the control circuitry provides drive signals to the first plurality of switching devices to operate all three legs corresponding to the first plurality of switching devices in an interleaved manner to generate a DC bus voltage of the intermediate DC bus; and
 if the control circuitry determines that the connected AC power system is a three phase system, the control circuitry provides drive signals to the first plurality of switching devices to operate two of the legs corresponding to the first plurality of switching devices in an interleaved manner to generate the DC bus voltage of the intermediate DC bus.

5. The power converter of claim 4 wherein the drive signals are PWM signals.

6. The power converter of claim 5 wherein the PWM signals cause each operating leg to operate as a boost converter.

7. The power converter of claim 1 wherein each of the legs corresponding to the second plurality of switching devices is coupled to its respective output terminal by an inductor.

8. The power converter of claim 2 wherein:
 if the control circuitry determines that the connected AC power system is a three phase system, the control circuitry provides drive signals to the first plurality of switching devices to operate each leg to generate an AC voltage that is 120 degrees out of phase with respect to the AC voltage generated by the other two legs.

9. The power converter of claim 8 wherein the drive signals are PWM signals.

10. The power converter of claim 1 wherein, if the connected AC power system is a single/split phase system, the third leg is operated intermittently.

11. An energy storage system comprising:
 a DC energy storage device;
 a power converter comprising,
  a first plurality of switching devices arranged in three legs, each leg having a high side switch and a low side switch, the first plurality of switching devices being coupled between the DC energy storage device and an intermediate DC bus of the power converter; and
  a second plurality of switching devices arranged in three legs, each leg having a high side switch and a low side switch, the second plurality of switching devices being coupled between the intermediate DC bus and an AC power system; and
 control circuitry that determines whether the AC power system is a single/split phase system or a three phase system and operates the first and second pluralities of switching devices accordingly, wherein:
  if the control circuitry determines that the connected AC power system is a single/split phase system:
   the control circuitry provides drive signals to the first plurality of switching devices to operate all three legs corresponding to the first plurality of switching devices in an interleaved manner to generate a DC bus voltage of the intermediate DC bus; and
   the control circuitry provides drive signals to the second plurality of switching devices to operate a first leg to generate a first AC voltage, a second leg to generate a second AC voltage that is 180 degrees out of phase with respect to the first AC voltage, and a third leg to balance the first and second voltages; or
  if the control circuitry determines that the connected AC power system is a three phase system:
   the control circuitry provides drive signals to the first plurality of switching devices to operate two of the legs corresponding to the first plurality of switching devices in an interleaved manner to generate the DC bus voltage of the intermediate DC bus; and
   the control circuitry provides drive signals to the first plurality of switching devices to operate each leg to generate an AC voltage that is 120 degrees out of phase with respect to the AC voltage generated by the other two legs.

12. The energy storage system of claim 11 wherein the DC energy storage device is a battery.

13. The energy storage system of claim 11 wherein the control circuitry comprises a microcontroller.

14. The energy storage system of claim 11 wherein the control circuitry comprises a plurality of voltage sensors each configured to monitor a magnitude and a phase of a voltage to allow the control circuitry to determine whether the AC power system is a single/split phase system or a three phase system and whether the AC power system is connected with a line to line or line to neutral fault condition.

15. The energy storage system of claim 14 wherein the plurality of voltage sensors comprise:
- a first voltage sensor connected between a first terminal and a second terminal of the AC power system;
- a second voltage sensor connected between the second terminal and a third terminal of the AC power system; and
- a third voltage sensor connected between the third terminal and a fourth terminal of the AC power system.

16. The energy storage system of claim 15 wherein:
- for a single/split phase AC system, the first terminal is a first line terminal, the second terminal is a neutral terminal, the third terminal is a second line terminal, and the fourth terminal is a ground terminal; and
- for a three phase AC system, the first terminal is a first line terminal, the second terminal is a second line terminal, the third terminal is a third line terminal, and the fourth terminal is a ground terminal.

17. An energy storage system comprising:
- a battery;
- a power converter comprising a first plurality of switching devices coupled to the battery and a second plurality of switching devices coupled between the first plurality of switching devices and an AC power system; and
- control circuitry that determines whether the AC power system is a single/split phase system or a three phase system and operates the first and second pluralities of switching devices accordingly;
- wherein the control circuitry comprises a microcontroller and a plurality of voltage sensors each configured to monitor a magnitude and a phase of a voltage to allow the control circuitry to determine whether the AC power system is a single/split phase system or a three phase system and whether the AC power system is connected with a line to line or line to neutral fault condition; and
- wherein the first plurality of switching devices comprises three legs, each leg having a first switch coupled between a first input terminal couplable to the energy storage device and a high rail of an intermediate DC bus and a second switch coupled between the first input terminal and a low rail of the intermediate DC bus, and
  - if the control circuitry determines that the connected AC power system is a single/split phase system, the control circuitry provides drive signals to the first plurality of switching devices to operate all three legs in an interleaved manner to generate a DC bus voltage of the intermediate DC bus; and
  - if the control circuitry determines that the connected AC power system is a three phase system, the control circuitry provides drive signals to the first plurality of switching devices to operate two legs in an interleaved manner to generate the DC bus voltage of the intermediate DC bus; and
- the second plurality of switching devices comprises three legs, each leg having a first switch coupled between a high rail of the intermediate DC bus and an output terminal couplable to the AC power system and a second switch coupled between a low rail of the intermediate DC bus and an output terminal couplable to the AC power system, and
  - if the control circuitry determines that the connected AC power system is a single/split phase system, the control circuitry provides drive signals to the second plurality of switching devices to operate a first leg to generate a first AC voltage, a second leg to generate a second AC voltage 180 degrees out of phase with respect to the first AC voltage, and a third leg to balance the first and second voltages; and
- if the control circuitry determines that the connected AC power system is a three phase system, the control circuitry provides drive signals to the first plurality of switching devices to operate each leg to generate an AC voltage that is 120 degrees out of phase with respect to the AC voltage generated by the other two legs.

18. The energy storage system of claim 17 wherein the plurality of voltage sensors comprise:
- a first voltage sensor connected between a first terminal and a second terminal of the AC power system;
- a second voltage sensor connected between the second terminal and a third terminal of the AC power system; and
- a third voltage sensor connected between the third terminal and a fourth terminal of the AC power system.

19. The energy storage system of claim 17 wherein:
- for a single/split phase AC system, the first terminal is a first line terminal, the second terminal is a neutral terminal, the third terminal is a second line terminal, and the fourth terminal is a ground terminal; and
- for a three phase AC system, the first terminal is a first line terminal, the second terminal is a second line terminal, the third terminal is a third line terminal, and the fourth terminal is a ground terminal.

* * * * *